United States Patent
Liao et al.

(10) Patent No.: US 9,306,515 B2
(45) Date of Patent: Apr. 5, 2016

(54) HYBRID CLASS OPERATION POWER AMPLIFIER

(71) Applicants: Hua-Yu Liao, New Taipei (TW); Cheng-Yu Wang, Taipei (TW); Ying-Tang Chang, Hsinchu (TW)

(72) Inventors: Hua-Yu Liao, New Taipei (TW); Cheng-Yu Wang, Taipei (TW); Ying-Tang Chang, Hsinchu (TW)

(73) Assignee: Shenzhen South Silicon Valley Microelectronics Co. Ltd, Shen Zhen (CN)

( * ) Notice: Subject to any disclaimer, the term of this patent is extended or adjusted under 35 U.S.C. 154(b) by 0 days.

(21) Appl. No.: 14/302,428

(22) Filed: Jun. 12, 2014

(65) Prior Publication Data

US 2015/0365058 A1    Dec. 17, 2015

(51) Int. Cl.
  *H03F 3/45* (2006.01)
  *H03F 3/68* (2006.01)
  *H03F 3/21* (2006.01)
  *H03F 3/19* (2006.01)

(52) U.S. Cl.
  CPC .............. *H03F 3/211* (2013.01); *H03F 3/19* (2013.01); *H03F 3/45076* (2013.01); *H03F 2200/451* (2013.01); *H03F 2203/21127* (2013.01); *H03F 2203/45116* (2013.01)

(58) Field of Classification Search
  USPC .......... 330/252–261, 295, 124 R, 53, 84, 286
  See application file for complete search history.

(56) References Cited

U.S. PATENT DOCUMENTS

| | | | |
|---|---|---|---|
| 7,414,478 B2* | 8/2008 | Elmala | H03F 3/602 330/295 |
| 8,150,343 B2* | 4/2012 | Ramachandra Reddy | 455/127.2 |
| 2013/0310114 A1* | 1/2013 | Zohny | H03F 3/193 455/571 |

* cited by examiner

*Primary Examiner* — Hieu Nguyen
(74) *Attorney, Agent, or Firm* — Jianq Chyun IP Office

(57) ABSTRACT

A power amplifier is provided. The power amplifier comprises a plurality of power amplifier units and a bias unit. The power amplifier units are connected in parallel with each other to receive a differential input signal. The power amplifier units perform a power amplifying so as to output a differential output signal. The bias unit is coupled to the power amplifier units and supplies a plurality of bias signals to the power amplifier units respectively. At least two of the power amplifier units are enable to operate in different class regions in according with the corresponding bias signals.

14 Claims, 6 Drawing Sheets

HYBRID CLASS OPERATION POWER AMPLIFIER

BACKGROUND OF THE INVENTION

1. Field of the Invention

The present invention relates to a power amplifier. More particularly, the present invention relates to a power amplifier comprising a plurality of power amplifier units operating in different class regions.

2. Description of Related Art

Wireless communication is without a doubt a popular research and commercial topic. Typically, wireless communication starts from a transmitter processing input signals to output signals that then transmit "wirelessly" to a receiver. Power amplifier (PA) is an important device in a radio frequency (RF) front-end circuit for a transmitter. Specifically, a power amplifier is used to amplify the broadcast signals at the transmission (TX) terminal of a radio frequency circuit. With the popularity of portable communication systems, maximum output power and output power efficiency has become the critical factors for the development of wireless transmission.

A conventional linear power amplifier, such as a class-A, a class-B or a class-AB power amplifier, biases an active device (the power amplifier) thereof by a fixed DC current, so as to obtain better linearity even though efficiency of the conventional power amplifier is poor due to a full-time DC power consumption. Moreover, when an input power is excessively significant, an output power thereof cannot be linearly amplified, which causes a gain compression and a signal distortion. At this time, a signal average output power has to be reduced to maintain the linearity, which is referred to as power back-off, so that the power amplifier cannot be operated in a high-efficiency interval, and an average efficiency of the power amplifier is reduced.

More specifically, in order to obtain better linearity performance, the DC current should be increased to enable the power amplifier operating in a class-A operating region. In the other hand, in order to increase output power efficiency of a power amplifier, the power amplifier sometimes operates in a class-AB or class-B operating region. In other words, the gate bias voltage of the power amplifier may be lowered. Namely, the current consumption and the linearity performance of the power amplifier are trade off with each other. Hence, how to enhance efficiency performance and lower current consumption of a power amplifier without reducing the maximum output power and linearity of operation of the device is important and required.

SUMMARY OF THE INVENTION

Accordingly, the present invention is directed to a power amplifier, which can to improve efficiency performance of the power amplifier and maintain high linearity performance via supplying different bias voltages to a plurality of power amplifier units of the power amplifier.

To achieve these and other advantages and in accordance with the purpose of the invention, as embodied and broadly described herein, the invention provides a power amplifier. The power amplifier comprises a plurality of power amplifier units and a bias unit. The power amplifier units are connected in parallel with each other to receive a differential input signal. The power amplifier units perform a power amplifying so as to output a differential output signal. The bias unit is coupled to the power amplifier units and supplies a plurality of bias signals to the power amplifier units respectively. At least two of the power amplifier units are enable to operate in different class regions in according with the corresponding bias signals.

According to one exemplary embodiment, each of the power amplifier units comprises an input stage unit and a cascode stage unit. The input stage unit receives and amplifies the differential input signal. The cascode stage unit is cascoded to the input stage unit. The cascode stage unit is controlled by the bias signals supplied by the bias unit so as to determine the class regions of each of the power amplifier units. So that, the cascode stage unit generates the differential output signal in according with the amplified differential input signal.

The invention provides a power amplifier comprising a first power amplifier unit, a second power amplifier unit and a bias unit. The first power amplifier unit and the second power amplifier unit are connected in parallel with each other to receive a differential input signal and perform a power amplifying so as to output a differential output signal. The bias unit is coupled to the first power amplifier unit and the second power amplifier unit. The bias unit supplies a first bias signal to the first power amplifier unit and supplies a second bias signal to the second power amplifier unit. The first power amplifier unit and the second power amplifier unit are enable to operate in different class regions in according with the first bias signal and the second bias signal respectively.

In summary, according to the power amplifier provided by the present invention, the power amplifier units of the power amplifier may be enable to operate in different class region, such as class-A, class-B or class-AB etc., in according with the bias voltage supplied by the bias unit. Comparing with the conventional power amplifier limited to operate in only one class region, the power amplifier provided by the present invention is not limited to operate in one class region, since the operating class regions of each of the power amplifier units of the power amplifier could be adjust by the bias unit. So that, the power amplifier provided by the present invention is much more flexible. During utilization of the power amplifier provided by the present invention, the suitable bias voltages are supplied to the power amplifier units to adjust the efficiency performance and linearity performance in different implement situation, so as to improve efficiencies and linearity of the power amplifier.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
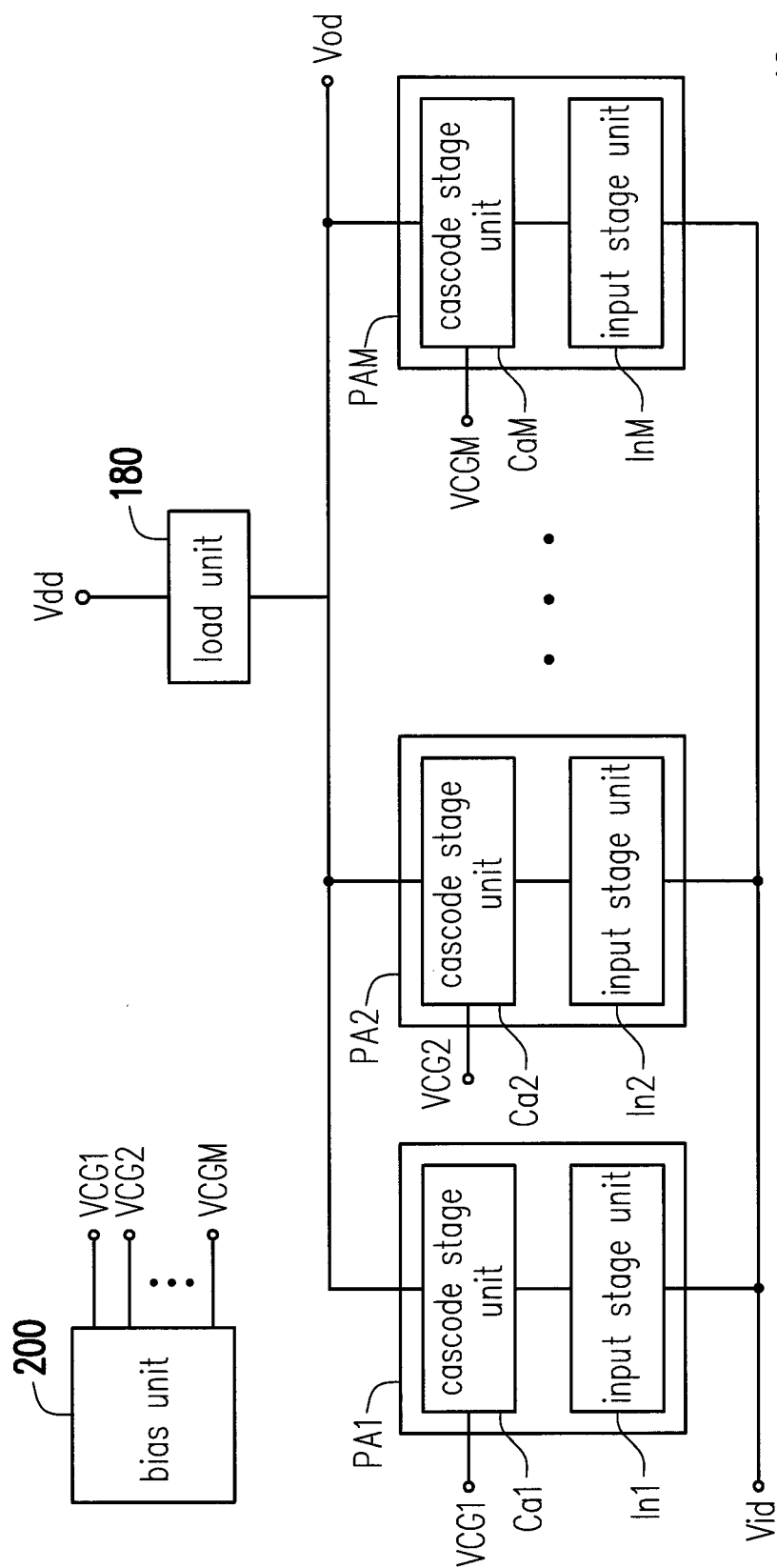
FIG. 1 is a schematic diagram of a power amplifier according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a power amplifier according to an embodiment of the invention. Referring to FIG. 1, the power amplifier 10 comprises M power amplifier units PA1, PA2, ..., PAM and a bias unit 200, wherein M is a integer greater than 1. The power amplifier units PA1, PA2, ..., PAM are connected in parallel with each other to receive a differential input signal Vid. The power amplifier units PA1, PA2, ..., PAM perform a power amplifying so as to output a differential output signal Vod. Besides, a load unit 180 is coupled between each of the power amplifier units PA1, PA2, ..., PAM and a reference voltage Vdd.

The bias unit 200 is coupled to each of the power amplifier units PA1, PA2, ..., PAM and supplies a plurality of bias signals VCG1, VCG2, ..., VCGM to the power amplifier units PA1, PA2, ..., PAM respectively. For example, the bias unit 200 supplies bias signals VCG1 to the power amplifier units PA1 and supplies bias signals VCG2 to the power amplifier units PA2. According to the above descriptions, it could be known that each of the power amplifier units PA1, PA2, ..., PAM may receive corresponding bias signals VCG1, VCG2, ..., VCGM from bias unit 200 respectively. Since the bias signals VCG1, VCG2, ..., VCGM are supplied to the power amplifier units PA1, PA2, ..., PAM individually, the operating class regions of the power amplifier units PA1, PA2, ..., PAM may be determined based on each of the bias signals VCG1, VCG2, ..., VCGM.

Referring to FIG. 1, each of the power amplifier units PA1, PA2, ..., PAM comprises an input stage unit and a cascode stage unit. For example, the power amplifier units PA1 comprises an input stage unit In1 and a cascode stage unit Ca1, the power amplifier units PA2 comprises an input stage unit In2 and a cascode stage unit Ca2, and the power amplifier units PAM comprises an input stage unit InM and a cascode stage unit CaM. Obviously, there are M input stage units In1, In2, ..., InM respectively in each of the power amplifier units PA1, PA2, ..., PAM, and there are M cascode stage units Ca1, Ca2, ..., CaM respectively in each of the power amplifier units PA1, PA2, ..., PAM.

The input stage units In1, In2, ..., InM receive and amplify the differential input signal Vid. The cascode stage units Ca1, Ca2, ..., CaM are cascoded to the input stage units In1, In2, ..., InM respectively. The cascode stage units Ca1, Ca2, ..., CaM are controlled by the bias signals VCG1, VCG2, ..., VCGM supplied by the bias unit 200 so as to determine the class regions of each of the power amplifier units PA1, PA2, ..., PAM. Accordingly, the cascode stage units Ca1, Ca2, ..., CaM generate the differential output signal Vod in according with the amplified differential input signal Vid.

In other words, the operating class regions of the power amplifier units PA1, PA2, ..., PAM may be different via being controlled by the bias unit 200. In the present embodiment, at least two of the power amplifier units are operated in different class regions in according with the corresponding bias signals. Since the class regions of the power amplifier units PA1, PA2, ..., PAM could be determined individually, the efficiency performance and linearity performance of the power amplifier 10 are not limited to be only one class type. Namely, the relation between the current consumption and linearity performance of the power amplifier 10 comprising the power amplifier units PA1, PA2, ..., PAM become adjustable.

Figure 2:
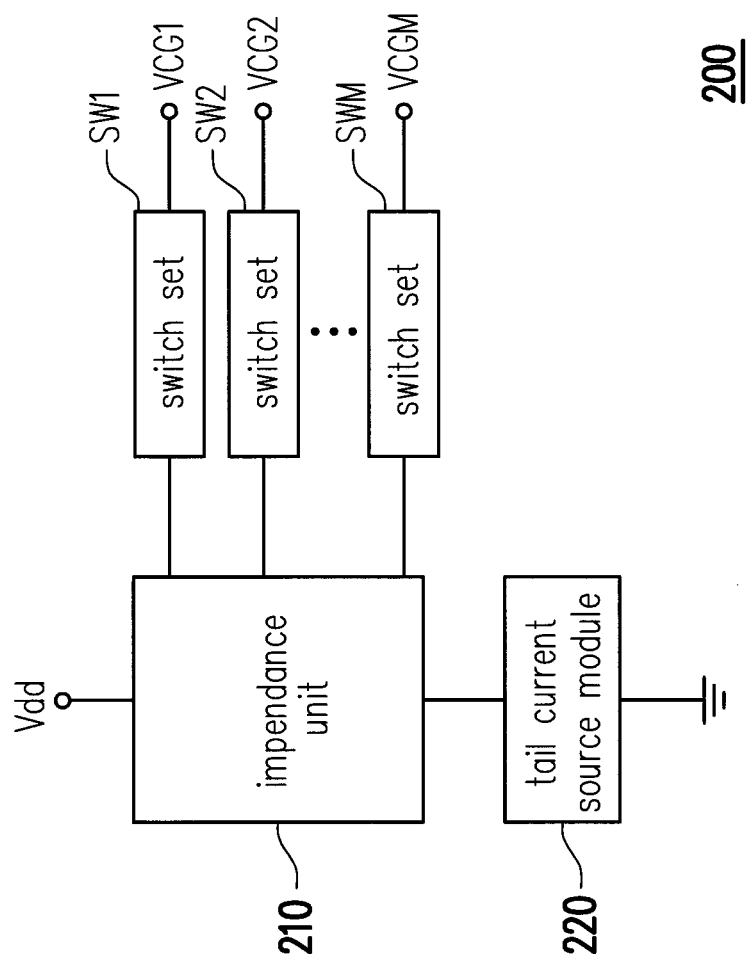
FIG. 2 is a schematic diagram of the bias unit of the embodiment illustrated in FIG. 1.

FIG. 2 is a schematic diagram of bias unit of the embodiment illustrated in FIG. 1. Referring to FIG. 2, the bias unit 200 comprises an impedance unit 210, a plurality of switch sets SW1, SW2, ..., SWM and a tail current source module 220. The impedance unit 210 is coupled to a reference voltage Vdd. In one embodiment, the impedance unit 210 may have a plurality of elements connected in serial with each other. The switch sets SW1, SW2, ..., SWM are respectively coupled between each of the power amplifier units PA1, PA2, ..., PAM and the impedance unit 210 so as to supply the bias voltages VCG1, VCG2, ..., VCGM to each of the power amplifier units PA1, PA2, ..., PAM. The switch sets SW1, SW2, ..., SWM can be implemented by switches, a multiplexer, a logic circuit or a combination thereof, which is not limited by the disclosure. Besides, the tail current source module 220 is coupled between the impedance unit 210 and a ground terminal. Through controlling the switch sets SW1, SW2, ..., SWM, the voltage level of each of the bias signals VCG1, VCG2, ..., VCGM is determined and the class regions of the power amplifier units PA1, PA2, ..., PAM are determined based on the bias signals VCG1, VCG2, ..., VCGM accordingly as well.

Figure 3:
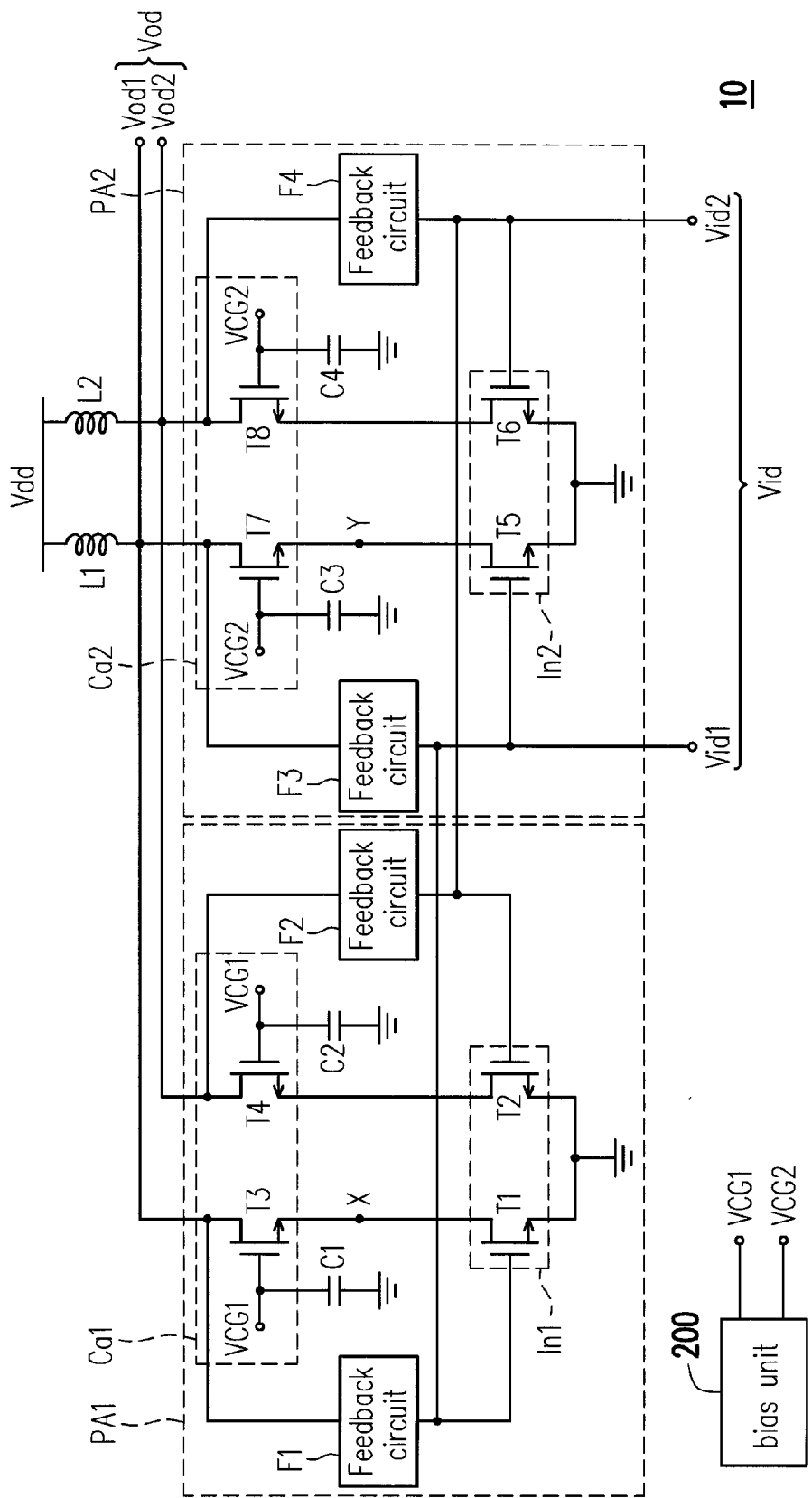
FIG. 3 is a schematic circuit diagram of the power amplifier of the embodiment illustrated in FIG. 1.

In order to describe the embodiment illustrated in FIG. 1 more clearly, FIG. 3 is a schematic circuit diagram of the power amplifier of the embodiment illustrated in FIG. 1. Besides, to describe the disclosure in detail, the power amplifier having two power amplifier units is taken as an example to describe the invention more clearly. In the following description, integer M of the embodiment of the FIG .1 is assumed to be equal to 2 but the invention is not limited thereto.

Referring to FIG. 3, in the case of M=2, power amplifier 10 comprising a first power amplifier unit PA1, a second power amplifier unit PA2 and a bias unit 200. The first power amplifier unit PA1 and the second power amplifier unit PA2 are connected in parallel with each other to receive a differential input signal Vid and perform a power amplifying so as to output a differential output signal Vod. In the embodiment illustrated in FIG. 3, the differential input signal Vid comprises a first input signal Vid1 and a second input signal Vid2, the differential output signal Vod comprises a first output signal Vod1 and a second output signal Vod2. In the present embodiment, the first input signal Vid1 and the second input signal Vid2 are differential to each other, and the first output signal Vod1 and the second output signal Vod2 are differential to each other.

In the embodiment illustrated in FIG. 3, a first load inductor L1 and a second load inductor L2 are connected in parallel with each other and coupled between a reference voltage Vdd and the first cascode stage unit Ca1 and the second cascode stage unit Ca2. The bias unit 200 is coupled to the first power amplifier unit PA1 and the second power amplifier unit PA2. The bias unit 200 supplies a first bias signal VCG1 to the first power amplifier unit PA1 and supplies a second bias signal VCG2 to the second power amplifier unit PA2. For example, the first bias signal VCG1 and the second bias signal VCG2 may be implemented as bias voltages supplied by the bias unit 200 and corresponding to different voltage level. Based on the controlling of the first bias signal VCG1 and the second bias signal VCG2, the first power amplifier unit PA1 and the second power amplifier unit PA2 are enable to operate in different class regions in according with the first bias signal VCG1 and the second bias signal VCG2 respectively.

Simply to say, the first power amplifier unit PA1 and the second power amplifier unit PA2 operate in the different class regions in according with the first bias signal VCG1 and the second bias signal VCG2 respectively. For example, the first power amplifier unit PA1 may be operated in the class-A region based on the first bias signal VCG1 having the higher bias voltage level, and the second power amplifier unit PA2 may be operated in the class-AB region based on the second bias signal VCG2 having the lower bias voltage, but the invention is not limited thereto.

More specifically, the first power amplifier unit PA1 includes a first input stage unit In1, a first cascode stage unit Ca1, a first feedback circuit F1, a second feedback circuit F2, a capacitor C1 and a capacitor C2. The first input stage unit In1 receives and amplifies the differential input signal Vid. The first cascode stage unit Ca1 is cascoded to the first input stage unit In1 and controlled by the first bias signal VCG1 supplied by the bias unit 200 so as to determine the class region of the first power amplifier unit PA1. The first cascode stage unit Ca1 generates the differential output signal Vod in according with the amplified differential input signal Vid.

Similarly, the second power amplifier unit PA2 includes a second input stage unit In2, a second cascode stage unit Ca2, a third feedback circuit F3, a forth feedback circuit F4, a capacitor C3 and a capacitor C4. The second input stage unit In2 receives and amplifies the differential input signal Vid. The second cascode stage unit Ca2 is cascoded to the second input stage unit In2 and controlled by the seocond bias signal VCG2 supplied by the bias unit 200 so as to determine the class region of the second power amplifier unit PA2. The second cascode stage unit Ca2 generates the differential output signal Vod in according with the amplified differential input signal Vid.

Referring to FIG. 3, the first input stage unit In1 includes a first transistor T1 and a second transistor T2, and the first cascode stage unit Ca1 includes a third transistor T3 and a forth transistor T4. The second input stage unit In2 includes a fifth transistor T5 and a sixth transistor T6, and the second cascode stage unit Ca2 includes a seventh transistor T7 and a eighth transistor T8. In this case, a first terminal of each of the transistors T1 through T8 is assumed to be a source, and a second terminal of each of the transistors T1 through T8 is assumed to be a drain. Besides, each of the transistors T1 through T8 described in the present exemplary embodiment is an N-type transistor, for example, which is not limited in the invention.

In the first input stage unit In1, the gate of the first transistor T1 receives the first input signal Vid1, and the source of the first transistor T1 is coupled to the ground terminal. The gate of the second transistor T2 receives the second input signal Vid2, and the source of the second transistor T2 is coupled to the ground terminal In the first cascode stage unit Ca1, the gate of the third transistor T3 is coupled to the bias unit 200 to receive the first bias signal VCG1. The source of the third transistor T3 is coupled to the drain of the first transistor T1. The drain of the third transistor T3 is coupled to the reference voltage Vdd via a first load inductor L1 and outputs the first output signal Vod1. The gate of the forth transistor T4 is coupled to the bias unit 200 to receive the first bias signal VCG1. The source of the forth transistor T4 is coupled to the drain of the second transistor T2. The drain of the forth transistor T4 is coupled to the reference voltage Vdd via a second load inductor L2 and outputs the second output signal Vod2.

Besides, the first feedback circuit F1 is coupled between the gate of the first transistor T1 and the drain of the third transistor T3. One terminal of the capacitor C1 is coupled to the gate of the third transistor T3, and the other terminal of the capacitor C1 is coupled to the ground terminal. The second feedback circuit F2 is coupled between the gate of the second transistor T2 and the drain of the forth transistor T4. One terminal of the capacitor C2 is coupled to the gate of the forth transistor T4, and the other terminal of the capacitor C2 is coupled to the ground terminal.

In the second input stage unit In2, the gate of the fifth transistor T5 receives the first input signal Vid1, and the source of the fifth transistor T5 is coupled to the ground terminal. The gate of the sixth transistor T6 receives the second input signal Vid2, and the source of the sixth transistor T6 is coupled to the ground terminal. In the second cascode stage unit Ca2, the gate of the seventh transistor T7 is coupled to the bias unit 200 to receive the second bias signal VCG2. The source of the seventh transistor T7 is coupled to the drain of the fifth transistor T5. The drain of the seventh transistor T7 is coupled to the reference voltage Vdd via a first load inductor L1 and outputs the first output signal Vod1. The gate of the eighth transistor T8 is coupled to the bias unit 200 to receive the second bias signal VCG2. The source of the eighth transistor T8 is coupled to the drain of the sixth transistor T6. The drain of the eighth transistor T8 is coupled to the reference voltage Vdd via a second load inductor L2 and outputs the second output signal Vod2.

Besides, the third feedback circuit F3 is coupled between the gate of the fifth transistor T5 and the drain of the seventh transistor T7. One terminal of the capacitor C3 is coupled to the gate of the seventh transistor T7, and the other terminal of the capacitor C3 is coupled to the ground terminal. The forth feedback circuit F4 is coupled between the gate of the sixth transistor T6 and the drain of the eighth transistor T8. One terminal of the capacitor C4 is coupled to the gate of the eighth transistor T8, and the other terminal of the capacitor C4 is coupled to the ground terminal.

Since the first bias signal VCG1 received by the third transistor T3 and the forth transistor T4 is different from the second bias signal VCG2 received by the seventh transistor T7 and the eighth transistor T8, the voltage level of the node X between the third transistor T3 and the forth transistor T4 is different from the voltage level of the node Y between the seventh transistor T7 and the fifth transistor T5 as well. In response to voltage level of the node X, the first power amplifier unit PA1 is enable to operate in the corresponding class region. Similarly, in response to voltage level of the node Y, the second power amplifier unit PA2 is enable to operate in the corresponding class region. Namely, the first power amplifier unit PA1 and the second power amplifier unit PA2 may operate in the different class regions in response to the different bias voltage levels received by the first cascode unit Ca1 and the second cascode unit Ca2.

Figure 4A:
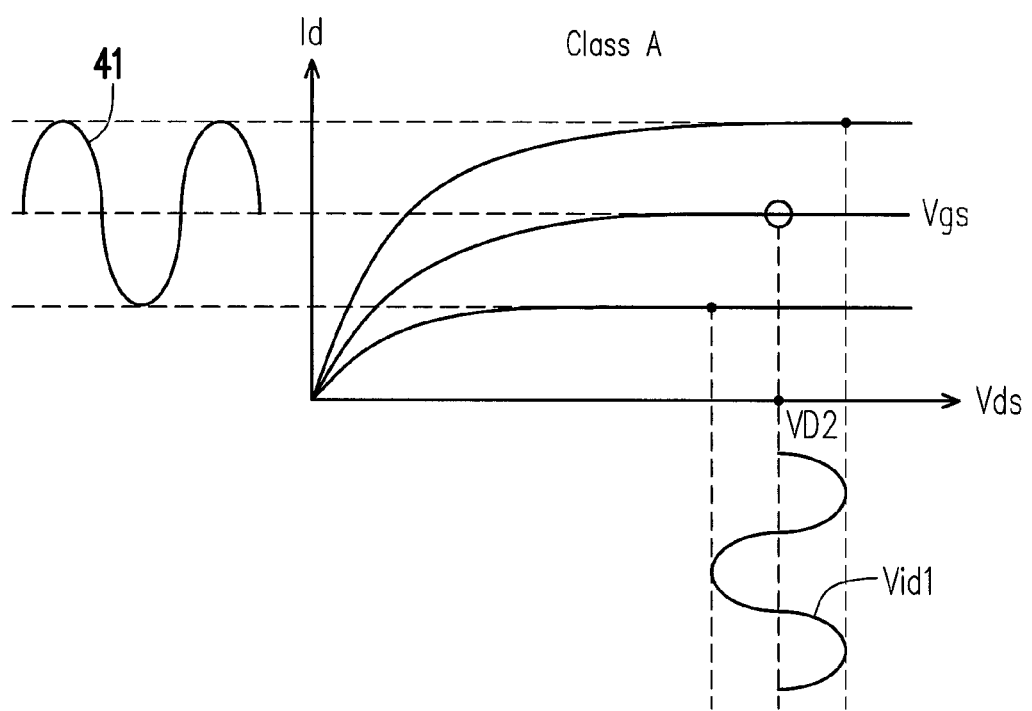
FIGS. 4A and 4B are curve graph illustrating an example of a characteristic of a voltage Vds between the source and the drain vs. the operation region of the transistor.
Figure 4B:
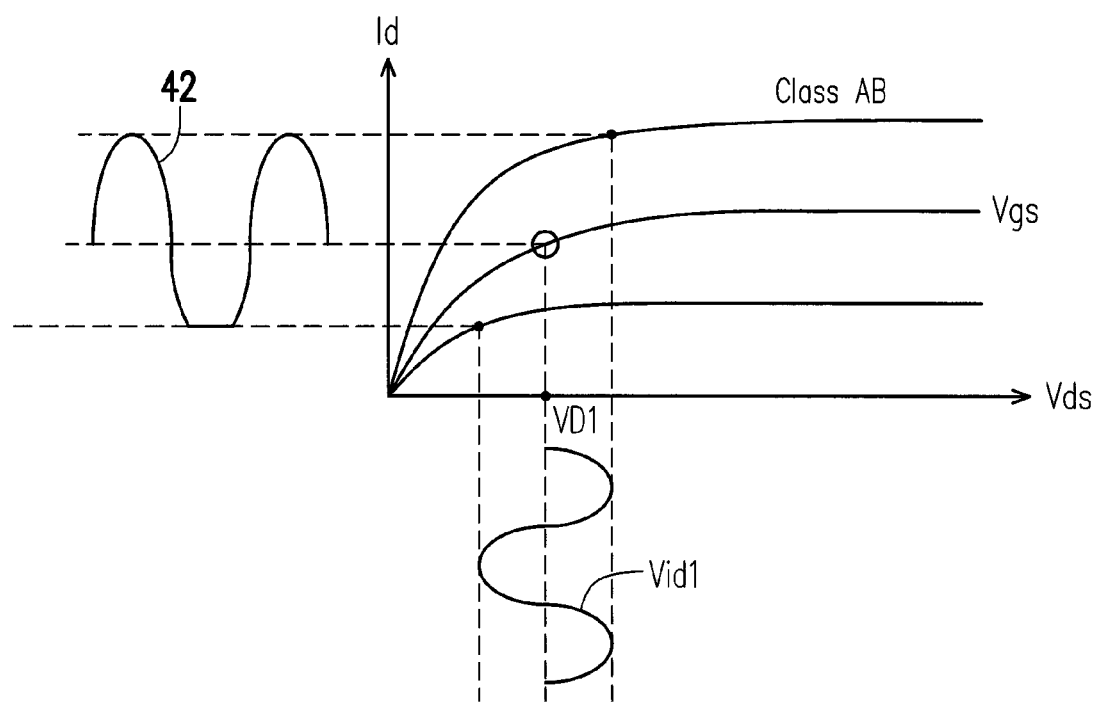

In detail, FIGS. 4A and 4B shows an example of a characteristic of a voltage Vds between the source and the drain vs. the operation region of the first transistor T1 and the fifth transistor T5. It should be known that, the first transistor T1 and the fifth transistor T5 are assumed to have identical transistor characteristics in the present embodiment, so that the characteristics curve of the first transistor T1 and the fifth transistor T5 are identical and illustrated in FIG.4. Referring to FIG 3. and FIG. 4, based on the first bias signal VCG1 and the second bias signal VCG2, the voltage level of the node X (Vds of the first transistor T1) and the voltage level of the node Y (Vds of the fifth transistor T5) are different. In the example showing the FIGS. 4A and 4B, under the condition of both of the first transistor T1 and the fifth transistor T5 are biased by the same Vgs (with respect to the first input signal Vid1), the voltage level of the node Y is VD2 and the voltage level of the node X is VD1, so that the first power amplifier unit PA1 and the second power amplifier unit PA2 are enable to operate in the different class regions associated with different linearity and current consumption. For example, the first power amplifier unit PA1 may be enable to operate as a Class-AB power amplifier and the second amplifier unit PA2 may be enable to operate as a Class-A power amplifier. More in detail, in the present embodiment shown in FIGS. 4A and 4B, the first power amplifier unit PA1 operating in Class-AB operating region may generate an output signal 42 in response to the first input signal Vid1. The second power amplifier unit PA2 operating in Class-A operating region may generate an output signal 41 in response to the first input signal Vid1. Base on above, the first output signal Vod1 may be generated based on the output signal 41 and the output signal 42.

Figure 5:
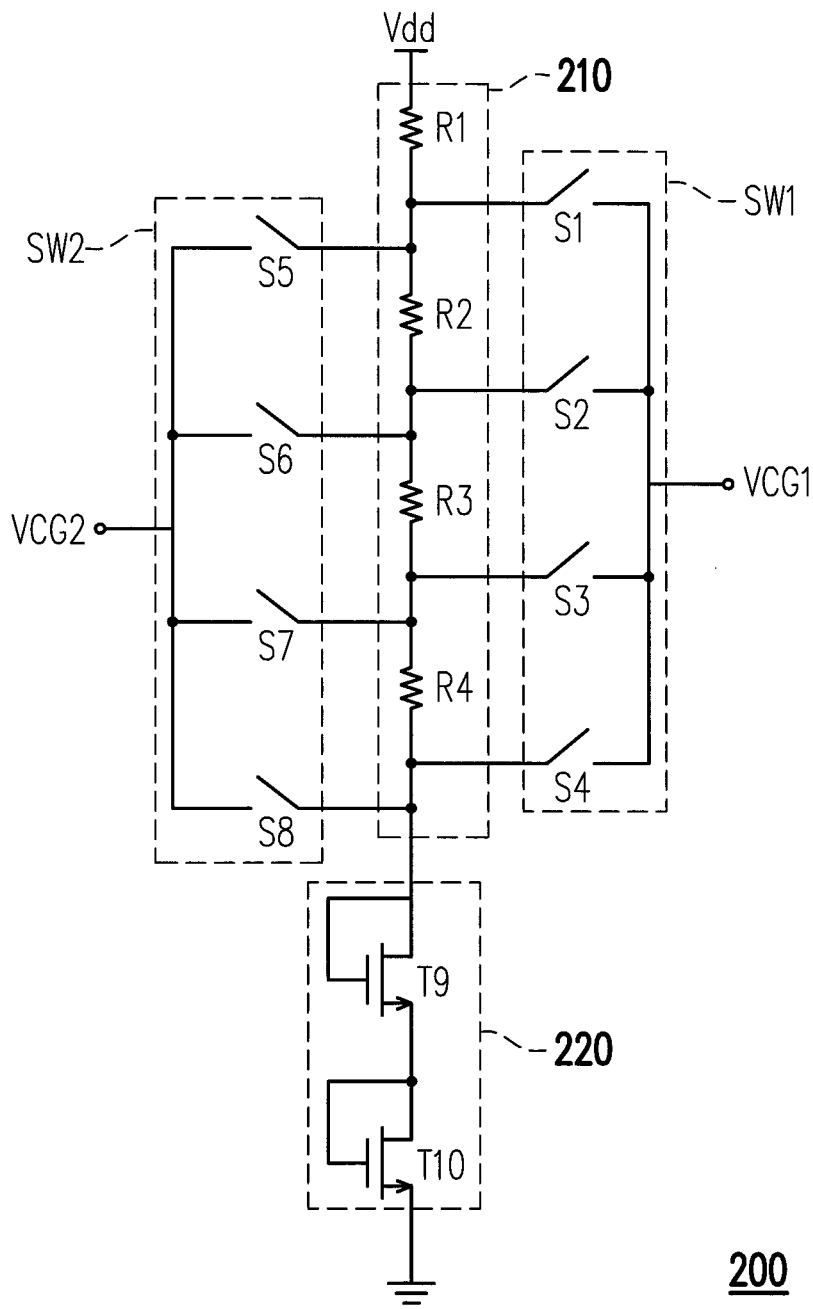
FIG. 5 is a schematic circuit diagram of the bias unit of the embodiment illustrated in FIG. 2.

In order to describe the embodiment illustrated in FIG. 2 more clearly, FIG. 5 is a schematic circuit diagram of the bias unit of the embodiment illustrated in FIG. 2. Referring to FIG. 5, in the case of M=2, since the amount of the power amplifier units is two, the bias unit 200 includes a first switch set SW1 and a second switch set SW2 for supplying the first bias signal VCG1 and the second bias signal VCG2. More specifically, the bias unit 200 includes a impedance unit 210, a first switch set SW1, a second switch set SW2 and a tail current source module 220. The impedance unit 210 is coupled to the reference voltage Vdd and includes a resistance R1, a resistance R2, a resistance R3 and a resistance R4. The resistance R1, the resistance R2, the resistance R3 and the resistance R4 are connected in serial with each other. It should be known that, the amount of the impedance elements of the impedance unit 210 is not limited in the invention, and the resistance could be replaced by other impedance elements in other embodiment.

The first switch set SW1 is coupled between the first power amplifier unit PA1 and the impedance unit 210 so as to supply the first bias signal VCG1 to the first power amplifier unit PA1. In the example illustrated in FIG.5, the first switch set SW1 includes a switch S1 a switch S2, a switch S3 and a switch S4. One terminal of the switch S1 is coupled between the resistance R1 and the resistance R2. The other terminal of the switch S1 is coupled to the first power amplifier unit PA1. One terminal of the switch S2 is coupled between the resistance R2 and the resistance R3. The other terminal of the switch S2 is coupled to the first power amplifier unit PA1. One terminal of the switch S3 is coupled between the resistance R3 and the resistance R4. The other terminal of the switch S3 is coupled to the first power amplifier unit PA1. One terminal of the switch S4 is coupled between the resistance R4 and the tail current source module 220. The other terminal of the switch S4 is coupled to the first power amplifier unit PA1.

Similarly, the second switch set SW2 is coupled between the second power amplifier unit PA2 and the impedance unit 210 so as to supply the second bias signal VCG2 to the second power amplifier unit PA2. In the example illustrated in FIG.5, the second switch set SW2 includes a switch S5, a switch S6, a switch S7 and a switch S8. One terminal of the switch S5 is coupled between the resistance R1 and the resistance R2. The other terminal of the switch S5 is coupled to the second power amplifier unit PA2. One terminal of the switch S6 is coupled between the resistance R2 and the resistance R3. The other terminal of the switch S6 is coupled to the second power amplifier unit PA2. One terminal of the switch S7 is coupled between the resistance R3 and the resistance R4. The other terminal of the switch S7 is coupled to the second power amplifier unit PA2. One terminal of the switch S8 is coupled between the resistance R4 and the tail current source module 220. The other terminal of the switch S8 is coupled to the second power amplifier unit PA2.

The tail current source module 220 is coupled between the impedance unit 210 and a ground terminal. The tail current source module 220 includes a N-type transistor T9 and a N-type transistor T10. The drain and the gate of the transistor T9 are connected together and coupled to the resistance R4. The drain and the gate of the transistor T10 are connected together and coupled to the source of the transistor T9. The source of the transistor T10 is coupled to the ground terminal. Obviously, base on the controlling of the switch S1 to switch S8, the first bias signal VCG1 and the second bias signal VCG2 having different voltage level could be supplied to the first power amplifier unit PA1 and the second power amplifier unit PA2 respectively.

Based on the schematic illustrated in FIG. 2 and FIG.5, a plurality of different bias signals could be generated without a plurality of bias units, the phenomenon of mismatch between different elements can be improved and a layout size of the circuit is reduced.

Although the description of FIG. 3 to FIG. 5 is a case of the power amplifier having two power amplifier units (M=2), but the person having skilled in the art should easily deduce/ analogize from/to other embodiments under more power amplifier units by explaining of the above exemplary embodiments, so that the detail description would be omitted herein, and the variation exemplary embodiments would fall within the scope of the present invention.

Accordingly, the power amplifier of the invention includes a plurality of power amplifier units operated in the different class region via different bias voltages. Based on the control of the bias signals, the linearity and the current consumption may be adjusted with respect to different situations. Therefore, the power amplifier of this invention has a high linearity of operation as well as a high efficiency in the different implement situation.

In addition, if the process technology factor is allowed, every power amplifier unit of the above-mentioned exemplary embodiment can be implemented by P-type transistors and such modified exemplary embodiment belongs to the claim scope of the invention as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power amplifier, comprising:
   a plurality of power amplifier units, connected in parallel with each other to receive a differential input signal, and performing a power amplifying so as to output a differential output signal; and
   a bias unit, coupled to the power amplifier units, and supplying a plurality of bias signals to the power amplifier units respectively,
   wherein at least two of the power amplifier units, which are connected in parallel with each other, respectively receive the different bias signals from the bias unit to respectively and simultaneously operate in different class regions in according with the different bias signals respectively received by the at least two of the power amplifier units, so as to output the differential output signal in response to the different class regions of the at least two of the power amplifier units,
   wherein the bias unit comprises:
   an impedance unit, coupled to a reference voltage, and having a plurality of impedance elements connected in serial with each other:
   a plurality of switch sets, respectively coupled between each of the power amplifier units and the impedance unit so as to supply the bias signals to each of the power amplifier units; and
   a tail current source module, coupled between the impedance unit and a ground terminal.

2. The power amplifier as claimed in claim 1, wherein each of the power amplifier units comprises:
- an input stage unit, receiving and amplifying the differential input signal; and
- a cascode stage unit, cascoded to the input stage unit, controlled by the bias signals supplied by the bias unit so as to determine the class regions of each of the power amplifier units, and generating the differential output signal in according with the amplified differential input signal.

3. The power amplifier as claimed in claim 2, wherein the differential input signal comprises a first input signal and a second input signal, and the input stage unit comprises:
- a first transistor, having a gate receiving the first input signal and a first terminal coupled to a ground terminal; and
- a second transistor, having a gate receiving the second input signal and a first terminal coupled to a ground terminal.

4. The power amplifier as claimed in claim 3, wherein the differential output signal comprises a first output signal and a second output signal, and the cascode stage unit comprises:
- a third transistor, having a gate coupled to the bias unit to receive the corresponding bias signal, a first terminal coupled to a second terminal of the first transistor, and a second terminal coupled to a reference voltage and outputting the first output signal; and
- a forth transistor, having a gate coupled to the bias unit to receive the corresponding bias signal, a first terminal coupled to a second terminal of the second transistor, and a second terminal coupled to the reference voltage and outputting the second output signal.

5. The power amplifier as claimed in claim 4, wherein each of the power amplifier units further comprises:
- a first feedback circuit, coupled between the gate of the first transistor and the second terminal of the third transistor; and
- a second feedback circuit, coupled between the gate of the second transistor and the second terminal of the forth transistor.

6. The power amplifier as claimed in claim 2 further comprises:
- a first load inductor and a second load inductor, connected in parallel with each other and coupled between a reference voltage and the cascode stage unit.

7. A power amplifier, comprising:
- a first power amplifier unit;
- a second power amplifier unit, wherein the first power amplifier unit and the second power amplifier unit are connected in parallel with each other to receive a differential input signal, and perform a power amplifying so as to output a differential output signal; and
- a bias unit, coupled to the first power amplifier unit and the second power amplifier unit, supplying a first bias signal to the first power amplifier unit, and supplying a second bias signal to the second power amplifier unit, wherein a voltage level of the first bias signal is different from a voltage level of the second bias signal,
- wherein the first power amplifier unit and the second power amplifier unit which are connected in parallel with each other, respectively receive the first bias signal and the second bias signal from the bias unit to respectively and simultaneously operate in different class regions in according with the first bias signal and the second bias signal respectively, so as to output the differential output signal in response to the different class regions of the first power amplifier unit and the second power amplifier unit,
- wherein the bias unit comprises:
- an impedance unit, coupled to a reference voltage, and having a plurality of impedance element connected in serial with each other;
- a first switch set, coupled between the first power amplifier unit and the impedance unit so as to supply the first bias signal to the first power amplifier unit;
- a second switch set, coupled between the second power amplifier unit and the impedance unit so as to supply the second bias signal to the second power amplifier unit; and
- a tail current source module, coupled between the impedance unit and a ground terminal.

8. The power amplifier as claimed in claim 7, wherein the first power amplifier unit comprises:
- a first input stage unit, receiving and amplifying the differential input signal; and
- a first cascode stage unit, cascoded to the first input stage unit, controlled by the first bias signal supplied by the bias unit so as to determine the class region of the first power amplifier unit, and generating the differential output signal in according with the amplified differential input signal.

9. The power amplifier as claimed in claim 8, wherein the differential input signal comprises a first input signal and a second input signal, the differential output signal comprises a first output signal and a second output signal, and the first input stage unit comprises:
- a first transistor, having a gate receiving the first input signal and a first terminal coupled to a ground terminal; and
- a second transistor, having a gate receiving the second input signal and a first terminal coupled to a ground terminal,
- wherein the first cascode stage unit comprises:
- a third transistor, having a gate coupled to the bias unit to receive the first bias signal, a first terminal coupled to a second terminal of the first transistor, and a second terminal coupled to a reference voltage and outputting the first output signal; and
- a forth transistor, having a gate coupled to the bias unit to receive the first bias signal, a first terminal coupled to a second terminal of the second transistor, and a second terminal coupled to the reference voltage and outputting the second output signal.

10. The power amplifier as claimed in claim 9, wherein the first power amplifier unit further comprises:
- a first feedback circuit, coupled between the gate of the first transistor and the second terminal of the third transistor; and
- a second feedback circuit, coupled between the gate of the second transistor and the second terminal of the forth transistor.

11. The power amplifier as claimed in claim 7, wherein the second power amplifier unit comprises:
- a second input stage unit, receiving and amplifying the differential input signal; and
- a second cascode stage unit, cascoded to the second input stage unit, controlled by the second bias signal supplied by the bias unit so as to determine the class region of the second power amplifier unit, and generating the differential output signal in according with the amplified differential input signal.

12. The power amplifier as claimed in claim 11, wherein the differential input signal comprises a first input signal and a second input signal, the differential output signal comprises a first output signal and a second output signal, and the second input stage unit comprises:
- a fifth transistor, having a gate receiving the first input signal and a first terminal coupled to a ground terminal; and
- a sixth transistor, having a gate receiving the second input signal and a first terminal coupled to a ground terminal, wherein the second cascode stage unit comprises:
- a seventh transistor, having a gate coupled to the bias unit to receive the second bias signal, a first terminal coupled to a second terminal of the fifth transistor, and a second terminal coupled to a reference voltage and outputting the first output signal; and
- a eighth transistor, having a gate coupled to the bias unit to receive the second bias signal, a first terminal coupled to a second terminal of the sixth transistor, and a second terminal coupled to the reference voltage and outputting the second output signal.

13. The power amplifier as claimed in claim 12, wherein the second power amplifier unit further comprises:
- a third feedback circuit, coupled between the gate of the fifth transistor and the second terminal of the seventh transistor; and
- a forth feedback circuit, coupled between the gate of the sixth transistor and the second terminal of the eighth transistor.

14. The power amplifier as claimed in claim 8 further comprises:
- a first load inductor and a second load inductor, connected in parallel with each other and coupled between a reference voltage and the first cascode stage unit and the second cascode stage unit.

* * * * *